(12) United States Patent
Lim et al.

(10) Patent No.: US 7,863,085 B2
(45) Date of Patent: Jan. 4, 2011

(54) ORGANIC THIN FILM TRANSISTOR, METHOD OF MANUFACTURING THE SAME, AND BIOSENSOR USING THE TRANSISTOR

(75) Inventors: Sang Chul Lim, Daejeon (KR); Seong Hyun Kim, Daejeon (KR); Yong Suk Yang, Daejeon (KR); Doo Hyeb Youn, Daejeon (KR); Zin Sig Kim, Daejeon (KR)

(73) Assignee: Electronics and Telecommunication Research Institute, Daejeon (KR)

( * ) Notice: Subject to any disclaimer, the term of this patent is extended or adjusted under 35 U.S.C. 154(b) by 0 days.

(21) Appl. No.: 12/244,364

(22) Filed: Oct. 2, 2008

(65) Prior Publication Data

US 2009/0278117 A1  Nov. 12, 2009

(30) Foreign Application Priority Data

May 7, 2008 (KR) .................. 10-2008-0042244
Jul. 22, 2008 (KR) .................. 10-2008-0071203

(51) Int. Cl.
*H01L 51/40* (2006.01)
(52) U.S. Cl. .................. 438/99; 257/40; 257/E51.005; 257/E51.015
(58) Field of Classification Search .................. 438/99, 438/95; 257/40, E51.011, E51.015, E31.029, 257/E51.005
See application file for complete search history.

(56) References Cited

U.S. PATENT DOCUMENTS

2004/0164294 A1* 8/2004 Son et al. ................. 257/40
2009/0026443 A1* 1/2009 Ohta ........................ 257/40

FOREIGN PATENT DOCUMENTS

JP  2004-241528 A  8/2004

(Continued)

OTHER PUBLICATIONS

Kovtyukhova et al. "Ultrathin nanoparticle ZnS and ZnS:Mn films: surface sol-gel synthesis, morphology, photophysical properties," Materials Science and Engineering, B69-70 (2002) 411-417.*

(Continued)

*Primary Examiner*—Julio J Maldonado
*Assistant Examiner*—Shaka Scarlett
(74) *Attorney, Agent, or Firm*—Rabin & Berdo, P.C.

(57) ABSTRACT

An organic thin film transistor (OTFT), a method of manufacturing the same, and a biosensor using the OTFT are provided. The OTFT includes a gate electrode, a gate insulating layer, source and drain electrodes, and an organic semiconductor layer disposed on a substrate and further includes an interface layer formed between the gate insulating layer and the organic semiconductor layer by a sol-gel process. The gate insulating layer is formed of an organic polymer, and the interface layer is formed of an inorganic material. The OTFT employs the interface layer interposed between the gate insulating layer and the organic semiconductor layer so that the gate insulating layer can be protected from the exterior and adhesion of the gate insulating layer with the organic semiconductor layer can be improved, thereby increasing driving stability. Also, since the OTFT can use a plastic substrate, the manufacture of the OTFT is inexpensive so that the OTFT can be used as a disposable biosensor.

4 Claims, 4 Drawing Sheets

FOREIGN PATENT DOCUMENTS

| KR | 10-2005-0004565 | 1/2005 |
|---|---|---|
| KR | 10-2005-0036171 | 4/2005 |
| KR | 10-2006-0016298 | 2/2006 |

OTHER PUBLICATIONS

D.K. Hwang et al., Comparative studies on the stability of polymer versus $SiO_2$ gate dielectrics for pentacene thin-film transistors, Applied Physics Letters, 2006.

Dong-Wook Park et al., Low hysteresis pentance thin-film transistors using $SiO_2$/cross-linked poly(vinyl alcohol) gate dielectric, Applied Physics Letters, 2006.

Sangyun Lee et al., Effects of hydroxyl groups in polymeric dielectrics on organic transistor performance, Applied Physics Letters, 2006.

* cited by examiner

ORGANIC THIN FILM TRANSISTOR, METHOD OF MANUFACTURING THE SAME, AND BIOSENSOR USING THE TRANSISTOR

CROSS-REFERENCE TO RELATED APPLICATION

This application claims priority to and the benefit of Korean Patent Application No. 2008-42244, filed May 7, 2008, and Korean Patent Application No. 2008-71203, filed Jul. 22, 2008, the disclosure of which is incorporated herein by reference in its entirety.

BACKGROUND

1. Field of the Invention

The present invention relates to an organic thin film transistor (OTFT), a method of manufacturing the same, and a biosensor using the OTFT, and more specifically, to an OTFT in which an interface layer is interposed between an organic gate insulating layer and an organic semiconductor layer to protect the organic gate insulating layer from the exterior and improve adhesion of the organic gate insulating layer with the organic semiconductor layer to thereby increase driving stability, a method of manufacturing the OTFT, and a biosensor using the OTFT.

2. Discussion of Related Art

In recent years, a vast amount of research has been conducted on organic thin film transistors (OTFTs) using organic materials having semiconductor characteristics instead of inorganic materials such as silicon semiconductors, which are widely used for TFTs. Electronic device technology based on organic materials may be utilized in the field of information technology for displaying and storing data and processing signals in computers, display devices, smart cards, wearable computers, and electronic papers (e-papers).

Although electronic and optical devices using organic semiconductors cannot completely replace conventional silicon-based inorganic devices, they are expected to overcome certain weaknesses of inorganic devices and create new fields of application.

An organic semiconductor forming a channel region of a TFT is a new material that exhibits characteristics of a semiconductor and a metal and has very high electrical conductivity. Also, the organic semiconductor is very lightweight and easier to fabricate than a conventional Si-based semiconductor device. Accordingly, the organic semiconductor is very advantageous in fabricating low-cost, large-area electronic devices. As a result, a considerable amount of research has focused on new application devices using an organic semiconductor not only in the field of electronics but also in medicine and biotechnology.

While conducting research on OTFTs using organic semiconductors, the present inventors found that an OTFT having an interface layer interposed between an organic gate insulating layer and an organic semiconductor layer works to protect the gate insulating layer from a sensing environment, improve adhesion of the gate insulating layer with the organic semiconductor layer to increase driving stability, and thus is optimal for use as a biosensor.

SUMMARY OF THE INVENTION

The present invention is directed to an organic thin film transistor (OTFT) having high reliability and stability.

Also, the present invention is directed to a method of manufacturing an OTFT having high reliability and stability.

Furthermore, the present invention is directed to a biosensor using an OTFT having high reliability and stability.

One aspect of the present invention provides an OTFT comprising a gate electrode, a gate insulating layer, source and drain electrodes, and an organic semiconductor layer disposed on a substrate and further comprising an interface layer interposed between the gate insulating layer and the organic semiconductor layer, wherein the gate insulating layer is formed of an organic polymer, and the interface layer is formed of an inorganic material.

Another aspect of the present invention provides a method of manufacturing an OTFT including forming a gate electrode, a gate insulating layer, an interface layer, source and drain electrodes, and an organic semiconductor layer on a substrate, wherein the gate insulating layer is formed by a wet process using an organic polymer, and the interface layer interposed between the gate insulating layer and the organic semiconductor layer is formed by a sol-gel process using an inorganic material.

Still another aspect of the present invention provides a biosensor comprising an organic thin film transistor including a gate electrode, a gate insulating layer, source and drain electrodes, and an organic semiconductor layer formed on a substrate and further including an interface layer disposed between the gate insulating layer and the organic semiconductor layer, wherein the organic semiconductor layer is formed of an organic material having a conducting main chain and a side chain replaced by an aptamer or label.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail with reference to the accompanying drawings.

FIGS. 1 through 4 are cross-sectional views of the structures of an organic thin film transistor (OTFT) according to exemplary embodiments of the present invention.

Figure 1:
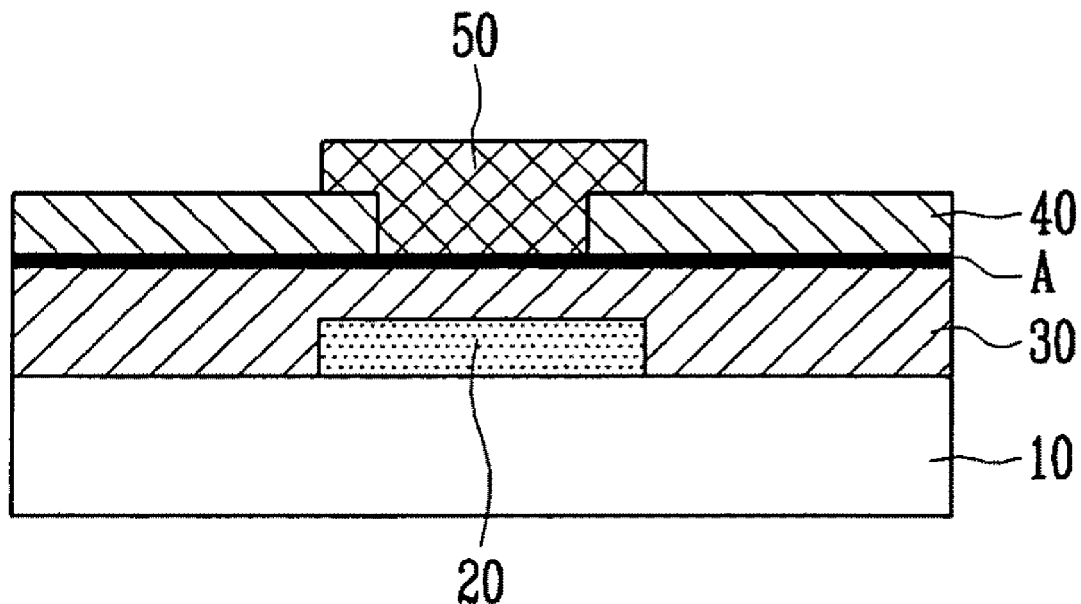
FIG. 1 is a cross-sectional view of an organic thin film transistor (OTFT) according to an exemplary embodiment of the present invention.
Figure 2:
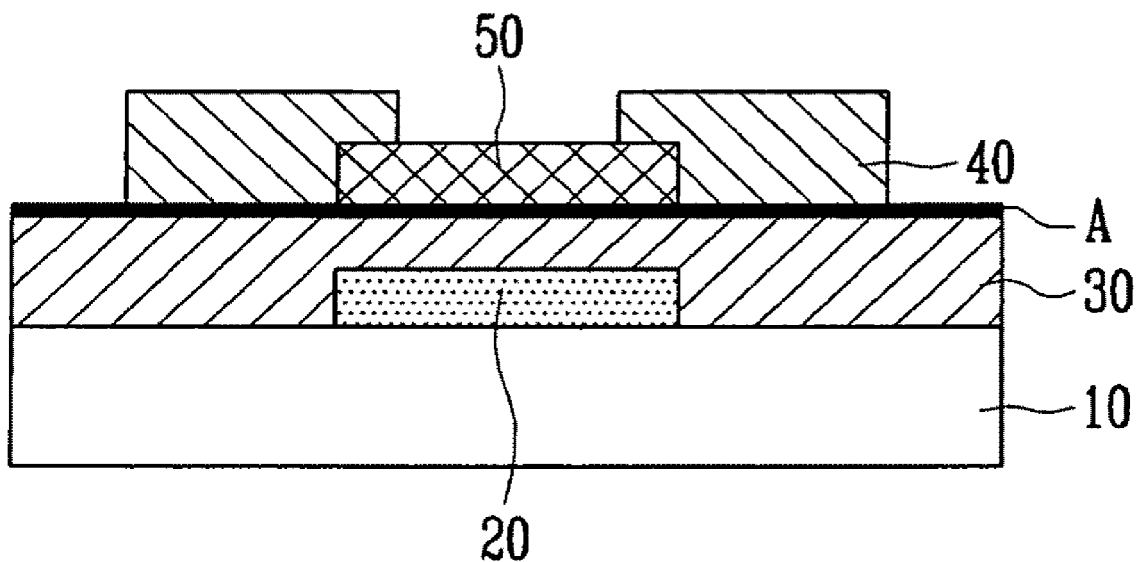
FIG. 2 is a cross-sectional view of an OTFT according to another exemplary embodiment of the present invention.
Figure 3:
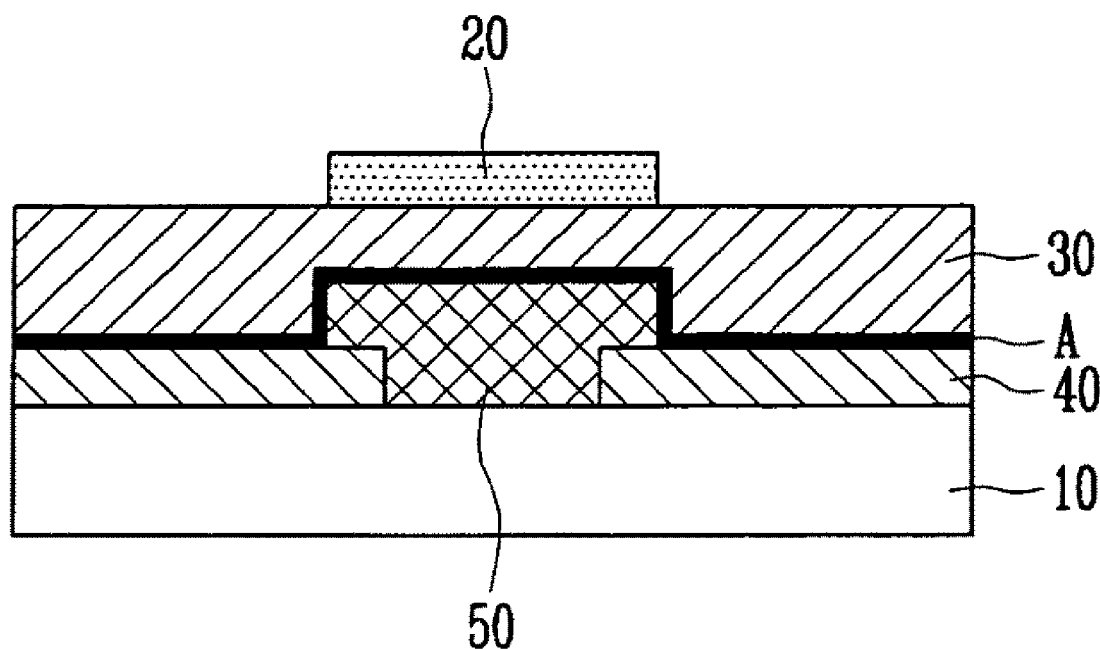
FIG. 3 is a cross-sectional view of an OTFT according to still another exemplary embodiment of the present invention.
Figure 4:
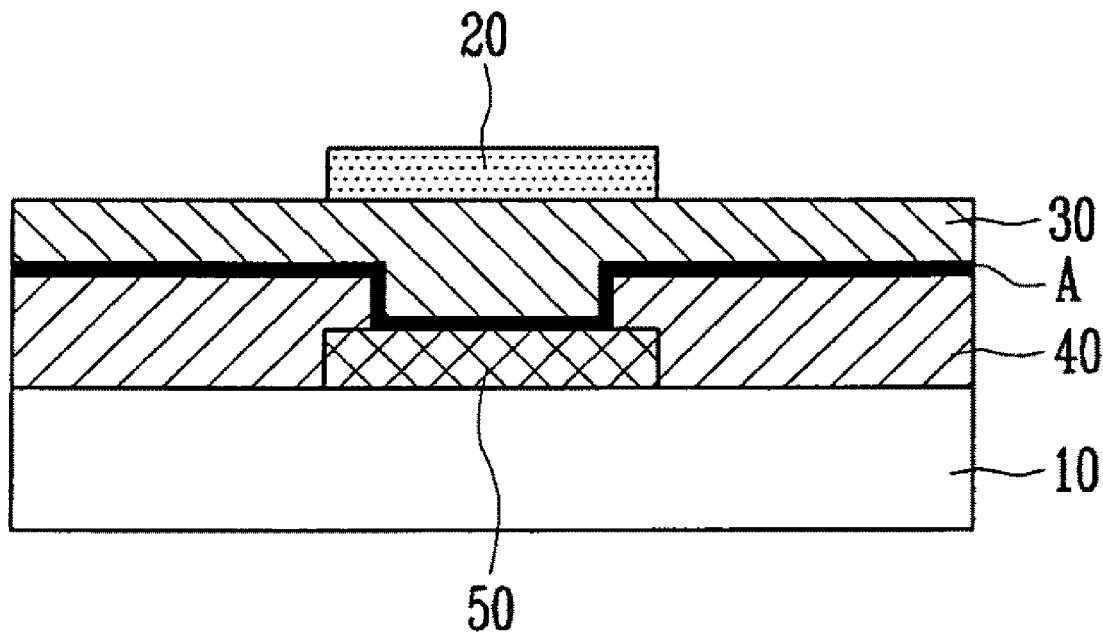
FIG. 4 is a cross-sectional view of an OTFT according to yet another exemplary embodiment of the present invention.

Referring to FIG. 1, an OTFT may have a bottom-gate inverted-coplanar structure in which a gate electrode 20, a gate insulating layer 30, an interface layer A, source and drain electrodes 40, and an organic semiconductor layer 50 are sequentially formed on a substrate 10. Referring to FIG. 2, an OTFT may have a bottom-gate inverted-staggered structure in which a gate electrode 20, a gate insulating layer 30, an interface layer A, an organic semiconductor layer 50, and source and drain electrodes 40 are sequentially formed on a substrate 10. Referring to FIG. 3, an OTFT may have a top-gate coplanar structure in which source and drain electrodes 40, an organic semiconductor layer 50, an interface layer A, a gate insulating layer 30, and a gate electrode 20 are sequentially formed on a substrate 10. Referring to FIG. 4, an OTFT may have a top-gate staggered structure in which an organic semiconductor layer 50, source and drain electrodes 40, an interface layer A, a gate insulating layer 30, and a gate electrode 20 are sequentially formed on a substrate 10.

An OTFT according to an exemplary embodiment of the present invention may include an interface layer formed of an inorganic material between an organic gate insulating layer 30 and an organic semiconductor layer 50.

For brevity, each layer will now be described in detail with reference to the bottom-gate inverted-coplanar OTFT of FIG. 1.

In the OTFT according to the present invention, the substrate 10 may be formed of a flexible material, specifically, a plastic material selected from the group consisting of polyethersulfone (PES), polyethyleneterephthalate (PET), polycarbonate (PC), polyimide (PI), polyethylene naphthalate (PEN), and polyacrylate (PAR) or a thin metal layer having an insulating layer.

The gate electrode 20 may be formed of a transparent oxide such as indium tin oxide (ITO), indium zinc oxide (IZO), or ZnO:Al(Ga), a low-resistance metal such as Ti, Ag, Au, Al, Cr, Al/Cr/Al, or Ni, or a conductive polymer. However, the present invention is not limited thereto. The gate electrode 20 may be obtained by forming a layer on the substrate 10 or an arbitrary pre-processed layer to an ordinary thickness using a sputtering process, an atomic layer deposition (ALD) process, or a chemical vapor deposition (CVD) process and patterning the formed layer.

The gate insulating layer 30 may be formed of an organic polymer having a high dielectric property on the substrate 10 having the gate electrode 20 or an arbitrary pre-processed layer using a wet process to a thickness of about several tens to several thousands of nm, preferably, but not necessarily, 50 to 120 nm. The organic polymer having a high dielectric property may be poly-4-vinyl phenol (PVP) or polyvinyl acetate (PVA), which may be dissolved in an organic solvent, such as N,N-dimethylformamide (DMF) or propylene glycol 1-monomethyl ether 2-acetate (PGMEA).

The polymer, such as PVP or PVA, may be highly soluble in an organic solvent and easily used to form a thin layer. However, since the polymer, such as PVP or PVA, has a low surface roughness and a high dielectric constant, a large leakage current may be generated. Therefore, various additives are required to make up for the weaknesses of the polymer.

During formation of the gate insulating layer 30, a photo-initiator and/or a thermal initiator may be partially or selectively added. The photo-initiator may be ammonium dichromate, and the thermal initiator may be methylated poly (melamine-co-formaldehyde). Several to several ten % by weight photo-initiator and/or thermal initiator may be added so that the gate insulating layer 30 can be patterned using light or heat.

Figure 5:
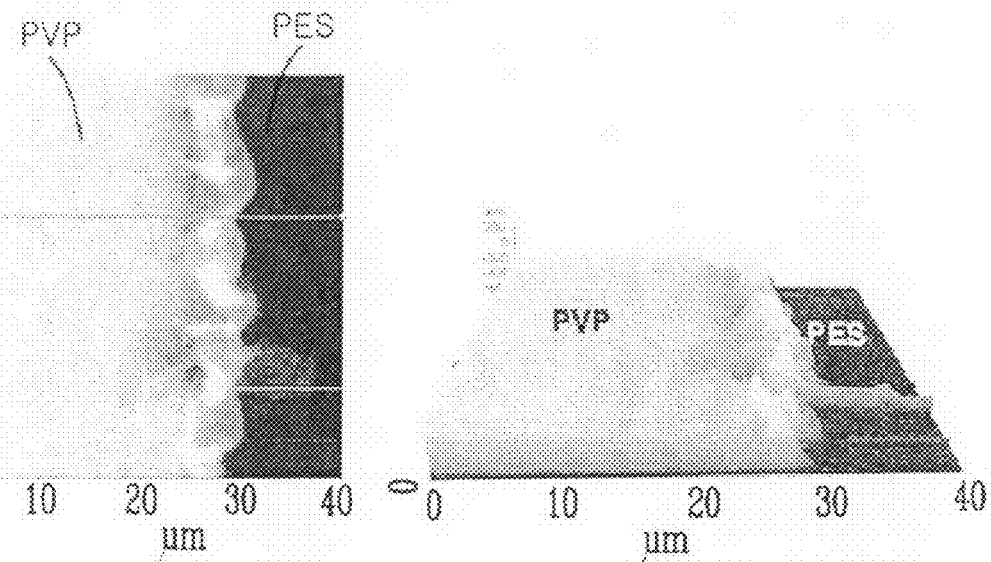
FIG. 5 shows atomic force microscope (AFM) images of a surface and an inclined cross-section of a patterned gate insulating layer formed of poly 4-vinyl phenol (PVP) on a plastic substrate.

The gate insulating layer 30 formed of an organic polymer may be patterned as can be seen in FIG. 5. FIG. 5 shows atomic force microscope (AFM) images of a surface and an inclined cross-section of a patterned gate insulating layer formed of PVP on a plastic substrate formed of PES. Referring to FIG. 5, it can be observed that a PVP region is clearly distinguished from a PES region exposed by dissolving PVP in a developer solution.

The interface layer A formed between the gate insulating layer 30 and the organic semiconductor layer 50 may be formed by a wet process using an inorganic material, such as ZnS, CdS, and (Zn, Cd)S.

The interface layer A may be formed on the gate insulating layer 30 or on the organic semiconductor layer 50 according to the structure of the OTFT, that is, depending on whether the OTFT is a bottom-gate type or a top-gate type.

The wet process used for forming the interface layer may be one selected from the group consisting of a spin coating process, a sol-gel process, an inkjet printing process, a dip coating process, a screen printing process, a Gravure printing process, an offset printing process, and an imprinting process.

Particularly, the interface layer A may be formed by a sol-gel process using a water solution containing zinc (Zn) ions or cadmium (Cd) ions and a water solution containing sulfur (S) ions. For example, the substrate 10 having the gate insulating layer 30 may be brought into contact with the water solution containing Zn ions or Cd ions and dried. Thereafter, the substrate 10 may be brought into contact with the water solution containing S ions and dried. Thus, a ZnS or CdS monomolecular layer may be formed. In this case, the thickness of the interface layer A may be determined by controlling the number of times the above-described process is repeated.

The interface layer A may be formed to a thickness of several to several tens of nm.

Like the gate electrode 20, the source and drain electrodes 40 may be formed of a transparent oxide such as indium tin oxide (ITO), indium zinc oxide (IZO), or ZnO:Al(Ga), a low-resistance metal such as Ti, Ag, Au, Al, Cr, Al/Cr/Al, or Ni, or a conductive polymer. However, the present invention is not limited thereto. Alternatively, the source and drain electrodes 40 may be a two layer structure formed of a metal and an oxide. The source and drain electrodes 40 may be obtained by depositing a layer on the interface layer A or an arbitrary pre-processed layer to an ordinary thickness using a sputtering process, an ALD process, or a CVD process and patterning the deposited layer.

The organic semiconductor layer 50 forming a channel region of the OTFT may be formed of any known material on the interface layer A having the source and drain electrodes 40 or an arbitrary pre-processed layer using a sputtering process, an ALD process, a CVD process, or a spin coating process. For example, the organic semiconductor layer 50 may be formed of pentacene, copper phthalocyanine, polythiophene, polyaniline, polyacetylene, polypyrrole, or polyphenylene vinylene.

Also, when the OTFT is used as a biosensor, the organic semiconductor layer 50 may function as an active layer for detecting an antigen-antibody reaction. Accordingly, the organic semiconductor layer 50 may be formed of an organic material having a conducting main chain and a side chain replaced by an aptamer or label, for example, poly(9,9-dioctylfluorene-co-bithiophene) alternating copolymer (F8T2).

Although not shown in the drawings, a protection layer may be formed on the organic semiconductor layer 50. For example, the protection layer may be obtained by forming a polymer layer using a spin coating process, a dip coating process, or a casting process and patterning the polymer layer.

Alternatively, the protection layer may be formed by depositing insulating materials using a CVD process or an ALD process and patterning the deposited layer.

Each of the above-described patterning processes may be performed using a photolithography process or a wet etching process.

Hereinafter, operation of a biosensor will be described with reference to FIG. 6, which shows construction of a biosensor to which the OTFT according to the present invention is applied.

Figure 6:
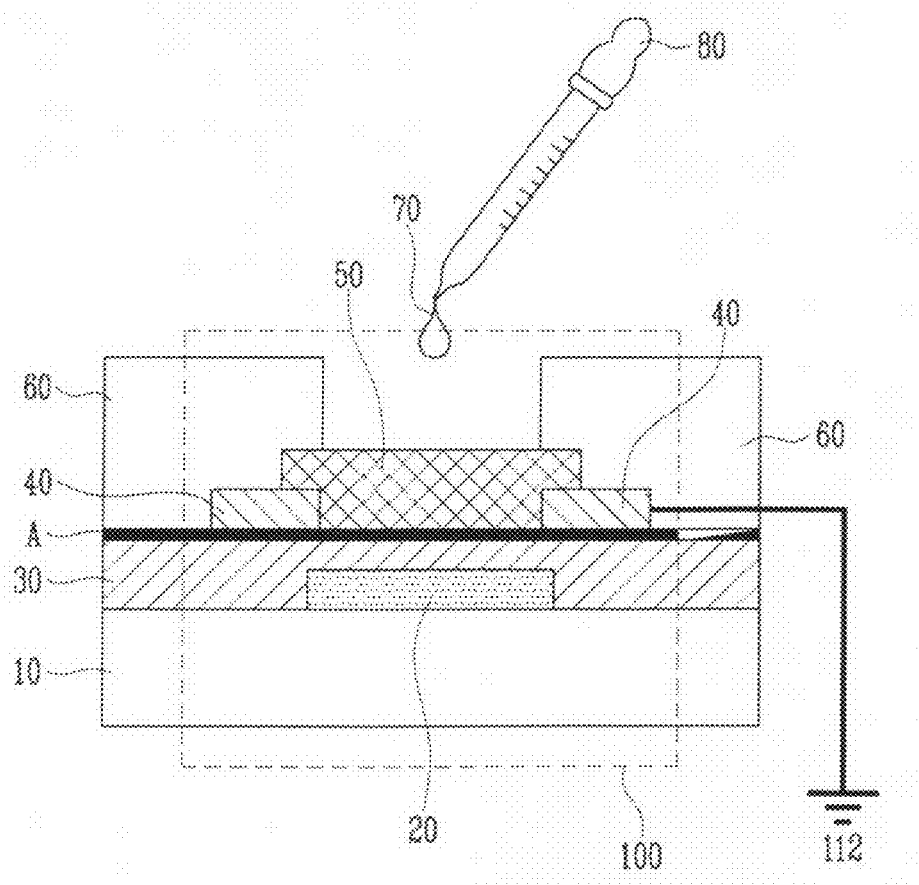
FIG. 6 is a cross-sectional view of a biosensor manufactured using an OTFT according to an exemplary embodiment of the present invention.

Referring to FIG. 6, in the OTFT 100 including a gate electrode 20, a gate insulating layer 30, an interface layer A, source and drain electrodes 40, an organic semiconductor layer 50, and a protection layer 60 sequentially formed on a substrate 10, a solution 70 containing a specific protein may be brought into contact with the organic semiconductor layer 50 using an injection device 80 (which may be of a syringe type) containing the solution 70 including the specific protein, so that the specific protein can be detected based on a change in the conductivity of the OTFT 100 due to a reaction of functional groups of an organic material of the organic semiconductor layer 50 with the solution 70.

Since an OTFT according to the present invention may employ a plastic substrate, the manufacture of the OTFT is inexpensive so that the OTFT can be used as a disposable biosensor. Also, an interface layer formed of an inorganic material may protect a gate insulating layer formed of an organic material from a sensing environment, thereby improving the accuracy of a biosensor.

The present invention will now be described in more detail with reference to the following exemplary embodiment. This invention may, however, be embodied in different forms and should not be construed as limited to the embodiment set forth herein. Rather, this embodiment is provided so that this disclosure is thorough and complete and fully conveys the scope of the invention to one skilled in the art.

Embodiment 1

A gate electrode was formed by depositing a Au layer to a thickness of about 100 nm on a PES substrate processed with $O_2$-plasma by a lithography process using an electronic beam (e-beam) apparatus and patterning the deposited Au layer. 1 g of PVP was sufficiently dissolved in 10 ml of DMF by stirring, 0.03 g of ammonium dichromate was added to a PVP solution, and the PVP solution containing ammonium dichromate was sufficiently mixed for 2 hours by stirring. Thereafter, the PVP solution was filtered using a 0.2-mm filter to minimize fine particles, and then spin-coated on the gate electrode for 180 seconds at a rate of 2500 rpm. The coated PVP solution was sufficiently maintained at room temperature in a vacuum state of about $10^{-1}$ Torr for 16 hours to evaporate an organic solvent, thereby forming a gate insulating layer to a thickness of about 80 nm. After that, the PES substrate was exposed to a dose of about 240 $mJ/cm^2$ of ultraviolet (UV) radiation for 8 minutes using a photo mask and a contact aligner in order to perform a crosslinking process, thereby patterning the gate insulating layer. Thereafter, the patterned gate insulating layer was developed using a developer solution obtained by mixing acetone and deionized water (DIW) in a ratio of 1:1 and annealed at a temperature of about 120° C. for 10 minutes. The PES substrate, which had the gate insulating layer having hydroxyl groups (—OH) on its surface, was dipped in a $Zn(OAc)_2$ water solution (91 mM, pH 6.7) for 5 minutes, rinsed using distilled water, and dried in an Ar atmosphere. Thereafter, the PES substrate was dipped in a $Na_2S$ water solution (4 mM, pH 11.05) for 2 minutes, rinsed using distilled water, and dried in an Ar atmosphere, thereby forming a ZnS monomolecular layer. By repeating the above-described process, a ZnS inorganic interface layer was formed to a thickness of about 10 nm. The process of forming the inorganic interface layer may be shown in the following diagram.

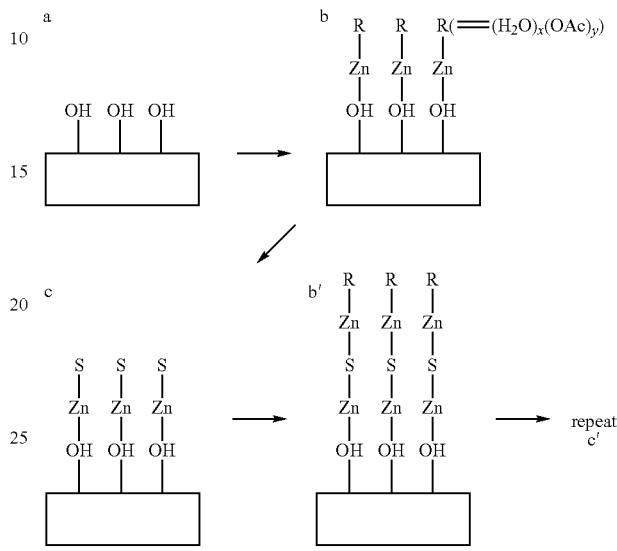

Figure 7:
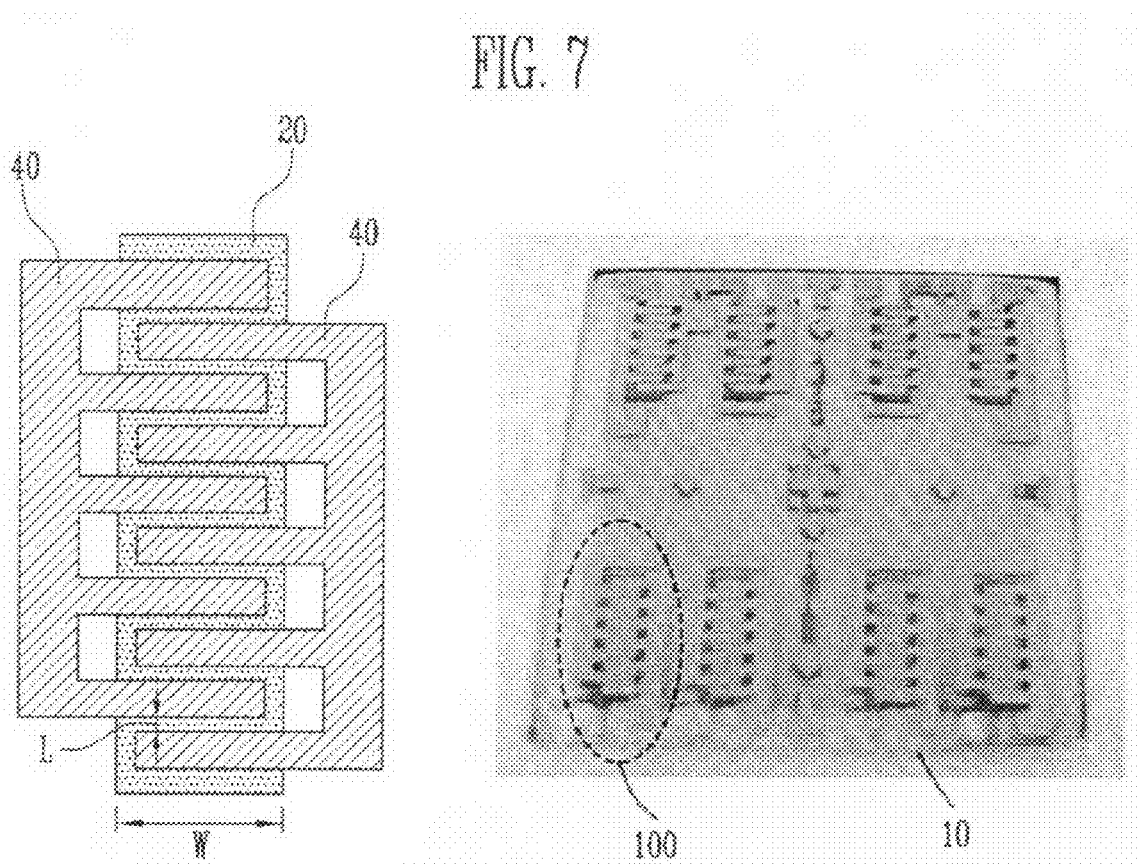
FIG. 7 is a plan view and a photograph of an OTFT according to an exemplary embodiment of the present invention.
Figure 8:
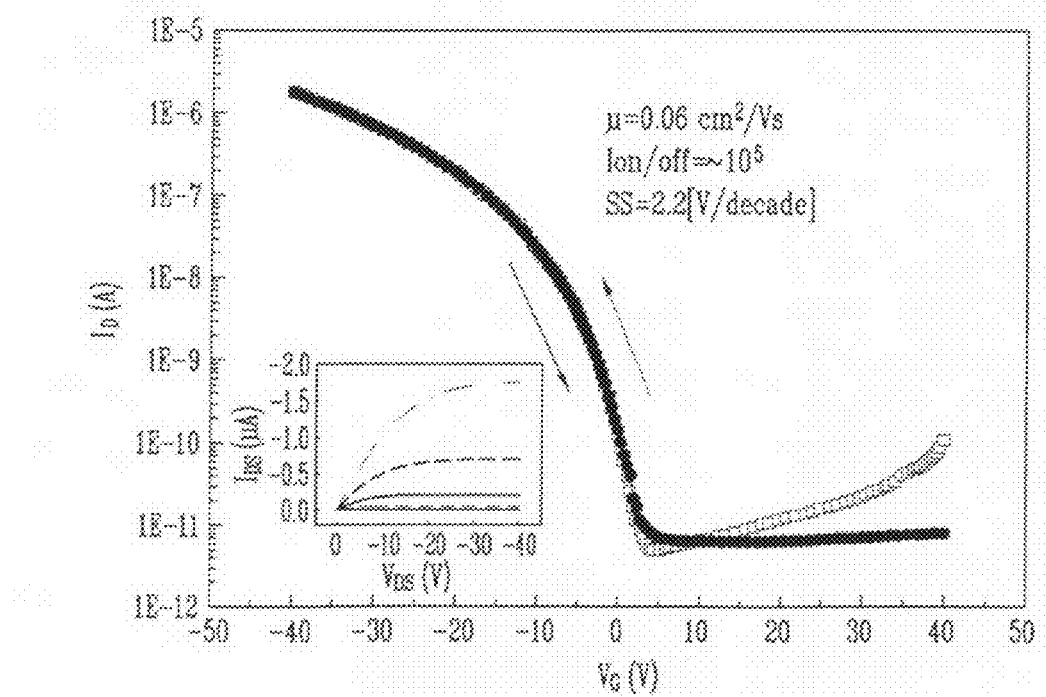
FIG. 8 is a graph showing on/off electrical characteristics of an OTFT according to an exemplary embodiment of the present invention.

A Au layer was formed on the inorganic interface layer by a lithography process using an e-beam apparatus, thereby forming source and drain electrodes to a thickness of about 80 nm. In this case, the source and drain electrodes were formed to be interdigitated. Thereafter, an organic semiconductor layer was formed of pentacene on the source and drain electrodes to a thickness of about 100 nm, thereby completing the manufacture of an OTFT. A plan view and photograph of the OTFT manufactured using the above-described process are shown in FIG. 7. Also, FIG. 8 shows on/off electrical characteristics of the OTFT. Referring to FIG. 8, it can be seen that the OTFT ensures high driving stability and exhibits no hysteresis characteristic.

An OTFT according to the present invention may employ an interface between an organic gate insulating layer and an organic semiconductor layer so that the gate insulating layer can be protected from the exterior and adhesion of the gate insulating layer with the organic semiconductor layer can be improved, thereby increasing the stability of the OTFT.

In the OTFT according to the present invention, since organic thin layers may be formed using wet processes and the interface layer may be formed using a sol-gel process, the OTFT can be manufactured on a plastic substrate at low cost on a large area.

Furthermore, since the OTFT according to the present invention may use the plastic substrate, the manufacture of the OTFT is inexpensive so that the OTFT can be easily used as a disposable biosensor.

In the drawings and specification, there have been disclosed typical exemplary embodiments of the invention and, although specific terms are employed, they are used in a generic and descriptive sense only and not for purposes of limitation. The scope of the invention is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing an organic thin film transistor comprising forming a gate electrode, a gate insulating layer, an interface layer, source and drain electrodes, and an organic semiconductor layer on a substrate, wherein the gate insulating layer is formed by a wet process using an organic polymer, and the interface layer interposed between the gate insulating layer and the organic semiconductor layer is formed by a sol-gel process using an inorganic material, wherein the interface layer is formed by a sol-gel process using a water solution containing cadmium (Cd) ions and a water solution containing sulfur (S) ions.

2. A method of manufacturing an organic thin film transistor comprising forming a gate electrode, a gate insulating layer, an interface layer, source and drain electrodes, and an organic semiconductor layer on a substrate, wherein the gate insulating layer is formed by a wet process using an organic polymer, and the interface layer interposed between the gate insulating layer and the organic semiconductor layer is formed by a sol-gel process using an inorganic material, and wherein the gate insulating layer is formed by a wet process using a solution obtained by dissolving poly-4-vinyl phenol (PVP) or polyvinyl acetate (PVA) in N,N-dimethylformamide (DMF) and a photo-initiator, and wherein the interface layer is formed by a sol-gel process using a water solution containing cadmium (Cd) ions and a water solution containing sulfur (S) ions.

3. The method according to claim 2, wherein the photo-initiator is ammonium dichromate.

4. The method according to claim 3, wherein the solution used for the wet process is obtained by dissolving polyvinyl acetate (PVA) in N,N-dimethylformamide (DMF).

* * * * *